(12) United States Patent
Li

(10) Patent No.: US 10,074,821 B2
(45) Date of Patent: Sep. 11, 2018

(54) SCREEN-PRINTING MASK, RELATED PACKAGING METHOD, DISPLAY PANEL, DISPLAY APPARATUS, AND METHOD FOR FABRICATING THE SAME

(71) Applicant: BOE TECHNOLOGY GROUP CO., LTD, Beijing (CN)

(72) Inventor: Yi Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/107,346

(22) PCT Filed: Dec. 28, 2015

(86) PCT No.: PCT/CN2015/099227
§ 371 (c)(1),
(2) Date: Jun. 22, 2016

(87) PCT Pub. No.: WO2017/016165
PCT Pub. Date: Feb. 2, 2017

(65) Prior Publication Data
US 2017/0207409 A1 Jul. 20, 2017

(30) Foreign Application Priority Data
Jul. 27, 2015 (CN) .......................... 2015 1 0447085

(51) Int. Cl.
*H01L 51/42* (2006.01)
*H01L 51/52* (2006.01)
(Continued)

(52) U.S. Cl.
CPC ............ *H01L 51/4246* (2013.01); *B41N 1/24* (2013.01); *H01L 51/524* (2013.01); *H01L 51/56* (2013.01)

(58) Field of Classification Search
None
See application file for complete search history.

(56) References Cited

U.S. PATENT DOCUMENTS

| 2008/0138653 A1* | 6/2008 | Lee | ........................... C03C 8/24 |
| | | | 428/690 |
| 2009/0136766 A1* | 5/2009 | Son | ........................... C03C 8/08 |
| | | | 428/432 |

(Continued)

FOREIGN PATENT DOCUMENTS

| CN | 1526850 A | 9/2004 |
| CN | 102237494 A | 11/2011 |

(Continued)

OTHER PUBLICATIONS

Screen Printing Masks, Kuroda Electric, Mar. 18, 2015, downloaded from URL<https://web.archive.org/web/20150318232557/http://www.kuroda-electric.eu/screen-mask> on Sep. 23, 2017.*

(Continued)

*Primary Examiner* — Joseph Schoenholtz
(74) *Attorney, Agent, or Firm* — Anova Law Group, PLLC

(57) ABSTRACT

The present disclosure provides a screen-printing mask for packaging organic light-emitting diode (OLED) products. The screen-printing mask includes a screen and a masking layer on the screen, the screen including a plurality of grids, and the masking layer including a plurality of blocking regions and a plurality of opening regions, the blocking regions being filled with a first blocking material, the opening regions corresponding to regions of an OLED substrate to be filled with a packaging material. In the opening regions, a first portion of the grids is exposed and a second portion of the grids is filled with a second blocking material, the first portion being a substantial portion of the grids.

14 Claims, 2 Drawing Sheets

(51) Int. Cl.
*H01L 51/56* (2006.01)
*B41N 1/24* (2006.01)

(56) References Cited

U.S. PATENT DOCUMENTS

2011/0260607 A1* 10/2011 Liu .................. H01L 51/525
                                              313/512
2016/0020432 A1*  1/2016 Yu .................. H01L 51/5246
                                              257/40
2016/0141557 A1*  5/2016 Kim ................. H01L 51/56
                                              438/28

FOREIGN PATENT DOCUMENTS

| CN | 102520831 A | 6/2012 |
|----|-------------|--------|
| CN | 202556884 U | 11/2012 |
| CN | 104332450 A | 2/2015 |
| CN | 104659073 A | 5/2015 |
| CN | 105058957 A | 11/2015 |
| JP | 50073708 A  | 6/1975 |
| JP | 50073709 A  | 6/1975 |
| JP | 2006092752 A | 4/2006 |
| JP | 4915312 B2 * | 4/2012 |
| JP | 3195772 U   | 1/2015 |
| WO | 9425276 A1  | 11/1994 |
| WO | 2014167989 A1 | 10/2014 |

OTHER PUBLICATIONS

Screen Printing Meash, Kuroda Electric, Mar. 18, 2015, downloaded from URL<https://web.archive.org/web/20150318232557/http://www.kuroda-electric.eu/screen-mask> on Sep. 23, 2017.*
Print out Wayback time machine for Kuroda Electric, Mar. 18, 2015.*
"Screen Printing Masks", Kuroda Electric, Mar. 18, 2015, downloaded from URL<https://web.archive.org/web/20150318232557/http://www.kuroda-electric.eu/screen-mask> on Sep. 23, 2017 (Kuroda).*
State Intellectual Property Office of the P.R.C (SIPO), Office Action 1 for 201510447085.2, dated Mar. 1, 2017, 8 Pages.
The World Intellectual Property Organization (WIPO), International Search Report for PCT/CN2015/099227, dated May 6, 2016.

* cited by examiner

SCREEN-PRINTING MASK, RELATED PACKAGING METHOD, DISPLAY PANEL, DISPLAY APPARATUS, AND METHOD FOR FABRICATING THE SAME

CROSS-REFERENCES TO RELATED APPLICATIONS

This application is a national phase entry under 35 U.S.C. § 371 of International Application No. PCT/CN2015/099227, filed on Dec. 28, 2015, which claims priority to Chinese Patent Application No. CN201510447085.2, filed on Jul. 27, 2015. The above enumerated patent applications are incorporated by reference herein in their entirety.

FIELD OF THE DISCLOSURE

The present disclosure generally relates to the field of display technologies and, more particularly, relates to a screen-printing mask and the fabricating method for fabricating the same, a related packaging method, a related display panel, and a related display apparatus.

BACKGROUND

Organic light-emitting diode (OLED) display panels have been widely used as novel advanced flat-panel display apparatus. OLED display panels often have advantages such as self-illuminating, high brightness level, high contrast, ultra-thin panels, low power consumption, wide viewing angles, and wide operational temperature ranges.

Currently, the organic layer in OLED display products may be susceptible to erosion caused by oxygen and moisture. The erosion on the organic layer impairs the service time of OLED products. In order to solve the problem, in existing OLED technology, the organic layer is often isolated from the outside environment by packaging. The existing packaging process includes applying frit on the periphery of the packaging cover by screen-printing. The frit is then pre-baked and laser radiation is then used to heat up and melt the frit after the pre-baking process. The melted frit bonds the packaging cover and the array substrate. However, the thermal expansion coefficient of the frit often does not match the thermal expansion coefficient of the materials, e.g., glass and/or metal, on the array substrate. After the packaging process, thermal stress remains in the packaged OLED products. Accumulation of the thermal stress may have adverse effect on the packaging of the OLED products.

BRIEF SUMMARY OF THE DISCLOSURE

The present disclosure provides a screen-printing mask for the packaging of OLED products. The screen-printing mask includes a screen and a masking layer on the screen. The screen includes a plurality of grids. The masking layer includes a plurality of blocking regions and a plurality of opening regions. The blocking regions are filled with a blocking material. The material used for printing, such as frit, is printed on a substrate, through the opening regions, to form a pattern corresponding to the shapes of the opening regions. In the areas where the screen and the opening regions overlap, some grids are filled with a suitable material, e.g., the blocking material.

One aspect of the present disclosure provides a screen-printing mask for packaging organic light-emitting diode (OLED) products. The screen-printing mask includes a screen and a masking layer on the screen, the screen including a plurality of grids, and the masking layer including a plurality of blocking regions and a plurality of opening regions, the blocking regions being filled with a first blocking material, the opening regions corresponding to regions of an OLED substrate to be filled with a packaging material. In the opening regions, a first portion of the grids is exposed and a second portion of the grids is filled with a second blocking material, the first portion being a substantial portion of the grids.

Optionally, the first blocking material and the second blocking material are a same material.

Optionally, the second portion of grids is used for forming bubble structures in a packaging material printed onto the OLED substrate through the opening regions.

Optionally, the second portion of grids is randomly distributed.

Optionally, the second portion of grids has a centralized distribution.

Optionally, in a region where the screen and the opening regions overlap, a ratio of a number of grids in the first portion to a number of grids in the second portion is between 20:1 and 20:5.

Optionally, a metal layer is on the regions of the OLED substrate to be filled with the packaging materials, the metal layer having a plurality of openings therein, the second portion of the grids forming a centralized distribution and a pattern of the second portion of the grids corresponding to a pattern of the openings in the metal layer.

Another aspect of the present disclosure provides a method for fabricating a screen-printing mask for packaging organic light-emitting diode (OLED) products. The method includes providing a screen, the screen including a plurality of grids; and forming a masking layer on the screen, the masking layer including opening regions and blocking regions, the blocking regions being filled with a first blocking material; and forming a masking layer on the screen, the masking layer including opening regions and blocking regions, the blocking regions being filled with a first blocking material, the opening regions corresponding to regions to be filled with a packaging material on an OLED substrate. The method also includes: in the opening regions where the screen and the opening regions overlap, forming a first portion of the grids being exposed and forming a second portion of the grids being filled with a second blocking material, the first portion being a substantial portion of the grids.

Optionally, the method further includes filling a second portion of grids in the opening region in areas where the screen and the opening regions overlap to form a plurality of grids filled with a second blocking material, a remaining portion of the grids in the opening region being exposed grids and a first portion of the grids in the opening region.

Optionally, the first blocking material and the second blocking material are a same material.

Optionally, the method further includes forming the second portion of grids in the opening region with the blocking region in the masking layer through one photolithography process.

Optionally, the second portion of grids is formed by filling corresponding grids with the second blocking material.

Optionally, after forming the second portion of the grids, a ratio of a number of grids in the first portion to a number of grids in the second portion is between 20:1 and 20:5.

Optionally, the second portion of grids has a random distribution.

Optionally, the second portion of grids has a centralized distribution.

Optionally, the grids in the second portion are distributed to have a preset pattern to prevent a packaging material from passing through during a packaging process.

Optionally, an adhesive, a gel, or a combination of an adhesive and a gel are used to seal the corresponding grids for forming the second portion of grids.

Another aspect of the present disclosure provides a packaging method using a disclosed screen-printing mask. The packaging method includes: forming a frit pattern on a first substrate using the screen-printing mask, the frit pattern including a plurality of bubble structures; and aligning and bonding the first substrate with the OLED substrate, and irradiating the frit pattern with laser.

Optionally, the bubble structures are formed by the plurality of grids filled with the second blocking material during the packaging process.

Another aspect of the present disclosure provides a display panel. The display panel includes: a first substrate and an OLED substrate being aligned to each other, and a frit pattern between the first substrate and the OLED substrate for bonding the first substrate and the OLED substrate, wherein the frit pattern is formed using a disclosed screen-printing mask.

Another aspect of the present disclosure provides a display apparatus. The display apparatus includes one or more of the disclosed display panels.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention.

The present disclosure provides a screen-printing mask. The screen-printing mask may include a screen and a masking layer arranged on the screen. The screen may include a plurality of grids. The masking layer may include a plurality of blocking regions and a plurality of opening regions. The blocking regions may be filled with a first blocking material. Material used for printing may be printed onto a substrate through the opening regions and form a pattern corresponding to the shape of the opening regions. In the areas where the screen and the opening regions overlap, some of grids may be filled with a second blocking material to form the second portion of the grids in the opening regions. The first blocking material and the second blocking material may be a same material or may be different materials. In one embodiment, the first material and the second material may be a same material. Other grids may be exposed grids, i.e., grids not filled with any materials, to form the first portion of the grids in the opening regions. In the disclosure, ink or frit can't pass through the grids filled with the second blocking material and be printed onto a substrate; and ink or frit can pass through the exposed grids and be printed onto a substrate.

According to the disclosed screen-printing mask provided by the present disclosure, some grids in the areas where the screen and the opening regions overlap may be filled with any blocking material. When using the screen-printing mask to form a frit pattern, i.e., a pattern made of frit, bubble structures may be formed in the frit pattern. After irradiating the frit pattern with laser radiation, the bubble structures may effectively prevent or reduce the spreading of thermal stress. The bubble structures may effectively reduce the adverse effects of the remaining thermal stress on the packaged product after the packaging process.

Figure 1:
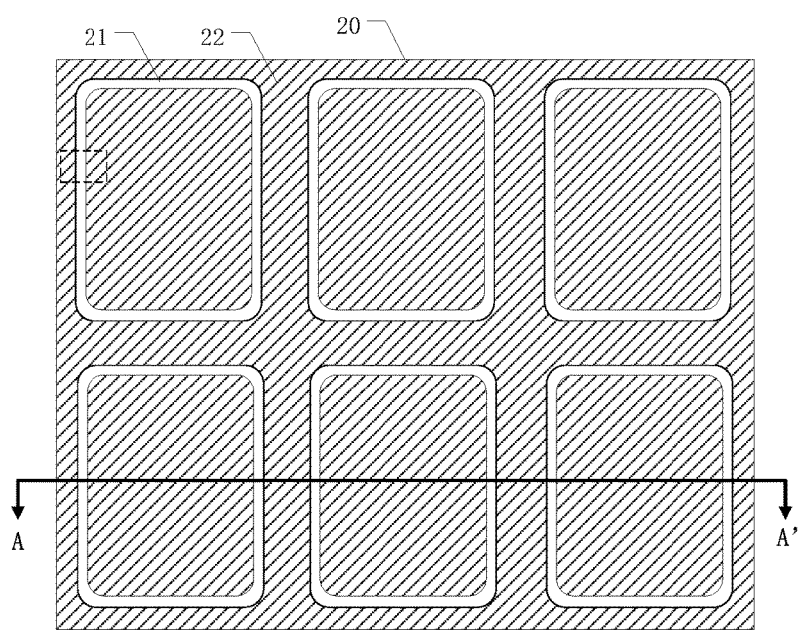
FIG. 1 illustrates a structure of an exemplary screen-printing mask according to the embodiment of the present disclosure.
Figure 2:
FIG. 2 illustrates a cross-sectional view of the screen-printing mask in the A-A' direction in FIG. 1.

FIG. 1 illustrates an exemplary screen-printing mask provided by the present disclosure. FIG. 2 illustrates a cross-sectional view of the screen-printing mask along the A-A' direction. The screen-printing mask may include a screen 10 and a masking layer 20 arranged on the screen 10. The screen 10 may include a plurality of grids arranged in an array. The masking layer 20 may include opening regions 21 and blocking regions 22. The blocking regions 22 may be filled with a first blocking material. In the areas where the screen 10 and the opening regions 21 overlap, some grids may be filled with a second blocking material, and other grids may be exposed, i.e., not filled with any material. The exposed grids may be referred as a first portion of the grids, and the grids filled with the second blocking material may be referred as a second portion of the grids. The first portion may represent a substantial portion of the total number of grids. The opening regions 21 may be used to let a packaging material pass through and to be printed onto a substrate. The blocking regions 22 may block or prevent the packaging material from passing through the screen 10. The blocking regions 22 may correspond to the regions not to be filled with packaging materials, e.g., frit, on a substrate, and the opening regions 21 may correspond to the regions to be filled with packaging materials on a substrate. For example, a blocking region 22 may correspond to an active area (AA) or a display region on an OLED substrate. An opening region 21 may correspond to a packaging region, e.g., on a periphery of an OLED substrate.

Figure 3:
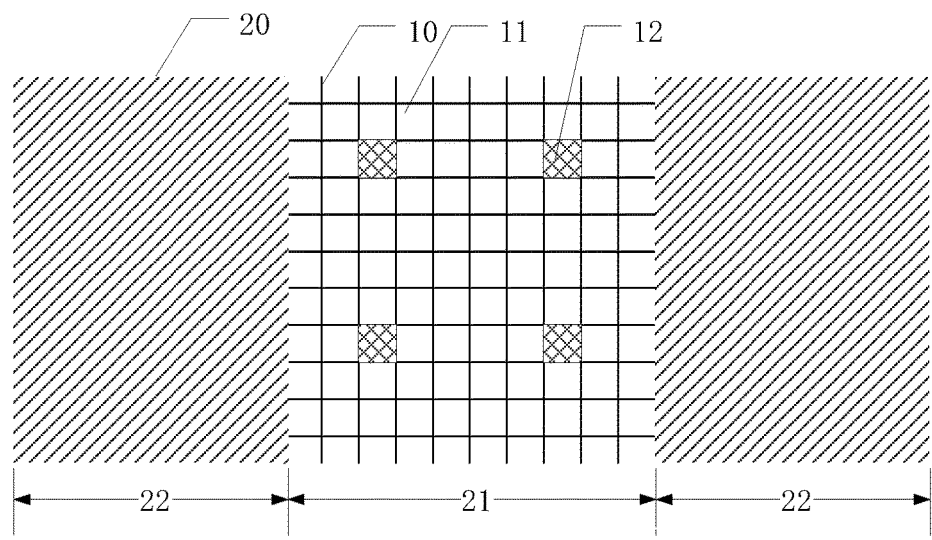
FIG. 3 illustrates an enlarged view of the area circled in the dashed box in FIG. 1.

As shown in FIG. 3, FIG. 3 may be an enlarged view of the part of the screen and screen-printing mask circled in the dashed box in FIG. 1. In an area where the screen 10 directly faces the opening regions 21, exposed grids 11, i.e., the first portion of grids, and grids filled with the second blocking material 12, i.e., the second portion of grids, may be arranged or formed. When the disclosed screen-printing mask is used to print frit onto a substrate, the frit may pass through the exposed grids 11 in the opening regions 21 and be printed onto a substrate. Frit pattern same as or corresponding to the pattern of the opening regions 21 may be formed on the substrate. Further, because the opening regions 21 may also include grids filled with the second blocking material 12, the grids filled with the second blocking material 12 may prevent frit from passing through and be printed onto a substrate. Bubble structures may be formed in the frit by the grids filled with the second blocking material 12. After irradiating the frit with laser, the bubble structures may effectively reduce or prevent the spreading of thermal stress. The bubble structures also may reduce the adverse effect of remaining thermal stress on the packaged product after the packaging process.

In one embodiment, in the areas where the screen 10 and the opening regions 21 overlap, the exposed grids 11 may account for a substantial portion of the total number of grids. A ratio of the number of the exposed grids 11 to the grids filled with the second blocking material 12 may be between 20:1 and 20:5. For example, the ratio may be 20:2, 20:3, or the like. Thus, the formed frit pattern may have improved resistance to thermal stress. Adverse effect to the printed frit due to the packaging process may be prevented or reduced.

In one embodiment, in the areas where the screen 10 and the opening regions 21 overlap, the grids filled with the second blocking material 12 may be randomly distributed or arranged. By using the randomly-distributed grids filled with the second blocking material 12, the bubbles structures may be randomly distributed in the frit pattern. Thus, the natural frequency of each location in the frit pattern may be different. The randomly distributed grids filled with the second blocking material 12 may thus improve the mechanical properties of the frit pattern, such as being shock-proof and shatter-proof, etc.

Figure 4:
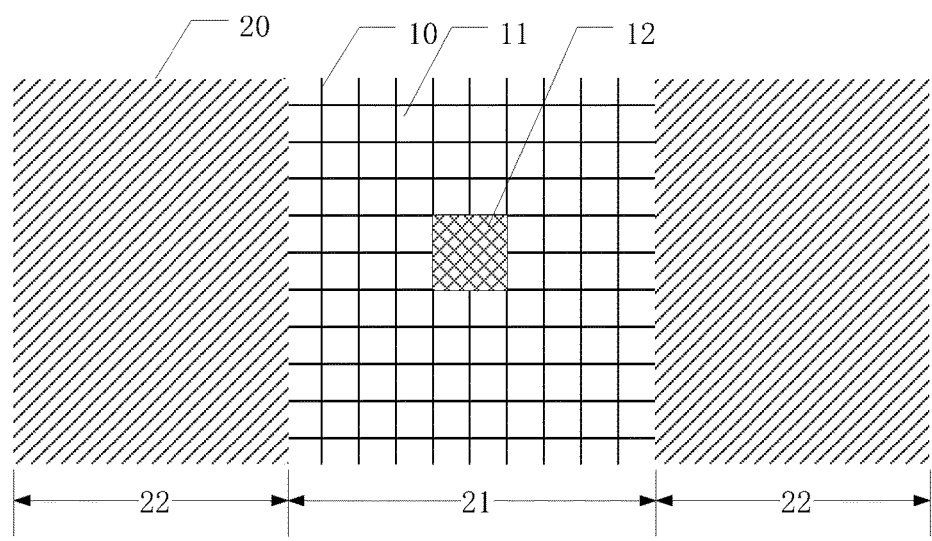
FIG. 4 illustrates an exemplary distribution of grids according to the embodiments of the present disclosure.

In addition, in the areas where the screen 10 and the opening regions 21 overlap, as shown in FIG. 4, a plurality of grids filled with the second blocking material 12 may have a centralized distribution. A preset or pre-designed pattern may be formed by the grids filled with the second blocking material 12. The pattern filled with the second blocking material may refer to a pattern in the screen 10 that ink or frit can't pass through and be printed onto a substrate. For example, in existing OLED array substrates, the packaging region often includes a metal layer. The metal layer may have a pattern, which includes a plurality of openings. When packaging the OLED array substrate, the frit not only contacts the metal layer but also contacts the glass substrate of the array substrate directly through the openings on the metal layer. Because the thermal expansion coefficient of the frit is different from the thermal expansion coefficients of the metal and the glass, the simultaneous contact between the frit and the metal/glass may further intensify the adverse effect caused by the thermal stress. Thus, the distribution of the grids filled with the second blocking material in the screen-printing mask may be determined according to the pattern with openings in the metal layer. For example, a plurality of grids filled with the second blocking material may be arranged in a centralized distribution in the region corresponding to the openings in metal layer. The plurality of grids filled with the second blocking material may also be arranged to form a same pattern or shape as the openings in the metal layer. Thus, frit may be formed according to the openings in pattern of the metal layer during a printing process. The formed frit pattern would not contact the glass substrate of the array substrate. The materials contacting the frit pattern may be reduced, and the adverse effect caused by the thermal stress may be further reduced. In some embodiments, the bubble structures may only be formed in the areas corresponding to the edges of the openings in the metal layer. The grids filled with the second blocking material for forming the bubble structures may be additional areas of the blocking regions or additional areas filled with the second blocking material.

In the screen-printing mask provided by the present disclosure, the mesh count of the screen 10 may range from 300×300 to 500×500 per square inch. For example, the mesh count may be 350×350 or 400×400 per square inch. The screen may be made of steel, nylon, or the like. The shape of a grid may be rectangular, square, rhombic, or the like.

In the screen-printing mask provided by the present disclosure, some grids, in the areas where the screen 10 and the opening regions 21 overlap, may be arranged or designed to be filled with the second blocking material. When using the screen-printing mask to form a frit pattern, the grids filled with the second blocking material may be used for forming bubble structures in the frit pattern. After irradiating laser on the frit pattern, the bubble structures may effectively reduce the spreading of thermal stress. The bubble structures may also enable the natural frequency of each location in the frit pattern to be different. Mechanical properties of the packaged OLED array substrate, such as being shock-proof and being shatter-proof, may be improved. In addition, the bubble structures may be used as a reinforcement or strengthening part of the OLED array substrate, such as dispersive strengthening parts. The bubble structures may effectively improve the strength of the frit. Yield of the packaged products, e.g., OLED array substrates, may be improved.

Further, the present disclosure also provides a method for fabricating the screen-printing mask. The method may include a plurality of steps.

First, a screen may be provided. The screen may include a plurality of exposed grids.

Further, a masking layer may be formed on the screen. The masking layer may include blocking regions and opening regions. The blocking regions may be formed with a first blocking material. The process to form the masking layer may include any suitable patterning process such as photolithography and a follow-up etch.

Further, in the areas where the screen and the opening regions overlap, a number of the exposed grids may be filled or sealed with a second blocking material.

For example, a resin layer may be deposited on the screen by a spin coating process. A photoresist layer may be deposited on the resin layer. A photolithography process and a follow-up etch may be used to form opening regions in the resin layer. The remaining photoresist may be stripped or removed. That is, a masking layer may be formed on the screen. The masking layer may include blocking regions and opening regions. The blocking regions may be formed with a first blocking material. A suitable adhesive or gel may be injected into the areas where the screen and the opening regions of the masking layer overlap to fill a number of the exposed grids. In this case, both the first material, for forming the blocking regions, and the second material, for forming the grids described above, may both be resin.

In one embodiment, the blocking regions of the masking layer and the grids filled with the second blocking material may be formed in one fabrication step. For example, a resin layer may be deposited on the screen through a spin coating process. Further, a photoresist layer, e.g., a negative photoresist, may be deposited on the resin layer. Further, the screen may undergo a first exposure. In the first exposure, the exposed regions may correspond to the blocking regions of the masking layer, and the unexposed regions may correspond to the opening regions of the masking layer. Further, the screen may undergo a second exposure. In the second exposure, only preset regions in the unexposed region in the first exposure may be exposed. The preset regions may correspond to the regions where the subsequently-formed grids filled with the second blocking material are located. After the first exposure and the second exposure, a development process may be used to remove the photoresist in the unexposed regions. A suitable etching process may be used to remove the unexposed resin in the resin layer. The remaining photoresist may be removed by any suitable stripping process. The screen-printing mask may be formed.

In some embodiments, the blocking regions of the masking layer and the grids filled with the second blocking material may be formed through one exposure. For example, a resin layer may be deposited on the screen by a spin coating process. Further, a photoresist layer, e.g., a negative photoresist, may be deposited on the resin layer. The screen may undergo an exposure. The exposed regions may correspond to the blocking regions of the masking layer and the subsequently-formed grids filled with the second blocking material in the opening regions. After the exposure, a development process may be used to remove the photoresist in the unexposed regions. A suitable etching process may be used to remove the unexposed resin in the resin layer. The remaining photoresist may be removed by any suitable stripping process. The screen-printing mask may be formed.

In some embodiments, a resin layer maybe omitted. Photoresist may be used as the material to form the blocking regions and the grids filled with the second blocking material in the opening regions of the screen-printing mask. A photoresist layer, e.g., a negative photoresist, may be formed and patterned on the screen. The screen may undergo an exposure. The exposed regions may correspond to the blocking regions of the masking layer and the subsequently-formed grids filled with the second blocking material in the opening regions. After the exposure, a development process may be used to remove the photoresist in the unexposed regions. The remaining photoresist, i.e., the exposed photoresist, may be used as the blocking regions and the grids filled with the second blocking material in the opening regions of the screen-printing mask. The screen-printing mask may be formed. In this case, both the first material, for forming the blocking regions, and the second material, for forming the grids described above, may both be photoresist.

In some embodiments, in the disclosed method, in the areas where the screen and the opening regions overlap, a ratio of the number of the exposed grids to the number of the grids filled with the second blocking material may be between 20:1 and 20:5.

To enhance the mechanical properties such as being shock-proof and being shatter-proof of the printed frit pattern, in the disclosed method, in the areas where the screen and the opening regions overlap, the grids filled with the second blocking material can be randomly distributed.

In addition, the plurality of grids filled with the second blocking material may have a centralized distribution according to different applications and/or designs. The grids filled with the second blocking material, having a centralized distribution, may have a preset pattern or shape.

The present disclosure further provides a packaging method. The packaging method may include a plurality of steps.

First, a frit pattern may be formed on a first substrate using the disclosed screen-printing mask. Bubble structures may be formed in the frit pattern by the grids filled with the second blocking material.

Further, the first substrate and a second substrate may be aligned and bonded with each other. Laser radiation may be used to irradiate the frit pattern.

The packaging method may be used for packaging OLED products. The first substrate may be a packaging cover and the second substrate may be an array substrate, e.g., an OLED substrate. The specific type of the first substrate and the second substrate should not be limited by the embodiments of the present disclosure. When the first substrate is an array substrate, the second substrate may be a packaging cover, and vice versa.

According to the packaging method provided by the present disclosure, using the disclosed screen-printing mask, bubble structures may be formed in the printed frit pattern. After irradiating laser on the frit, the bubble structures may effectively reduce the spreading of thermal stress. The bubble structures may also enable the natural frequency of each location in the frit pattern to be different. Some mechanical properties such as shock-proof, shatter-proof, of the frit may be improved. In addition, the bubble structures may also be a reinforcement of the frit pattern, such as dispersive strengthening parts. The strength of the frit may be improved.

The screen-printing mask provided by the present disclosure may include several advantages.

In the screen-printing mask provided by the present disclosure, some grids, in the areas where the screen and the opening regions overlap, may be arranged or designed to be filled with a second blocking material. The second blocking material used to fill the grids and a first blocking material used to fill the blocking region of the screen-printing mask may be a same material or may be different materials. When using the screen-printing mask to form a frit pattern, the grids filled with the second blocking material may be used for form bubble structures in the frit pattern. After irradiating laser on the frit pattern, the bubble structures may effectively reduce or prevent the spreading of thermal stress. Further, by randomly distributing the bubble structures, the natural frequency of each location in the frit pattern may be different. Mechanical properties of the packaged OLED array substrate, such as being shock-proof and being shatter-proof, may be improved. In addition, the bubble structures may be used as a reinforcement or strengthening part of the OLED array substrate, such as dispersive strengthening parts. The bubble structures may effectively improve the strength of the frit. Adverse effect to the packaged product, caused by the remaining thermal stress after the packaging process, may be effectively reduced.

The present disclosure also provides a display panel. The display panel may include a first substrate, a second substrate, and a frit pattern arranged between the first substrate and the second substrate. The first substrate and the second substrate may be aligned and bonded to each other through the frit pattern. The frit pattern may be formed by the disclosed screen-printing mask.

The present disclosure also provides a display apparatus. The display apparatus may include the display panel. The disclosed display apparatus may be a laptop screen, a monitor, a television, a digital frame, a cell phone, a tablet, or any product or part with a display function.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A screen-printing mask for packaging organic light-emitting diode (OLED) products, comprising:
a screen and a masking layer on the screen, the screen including a plurality of grids, and the masking layer including a plurality of blocking regions and a plurality of opening regions, the blocking regions being filled with a first blocking material, the opening regions corresponding to regions of an OLED substrate to be filled with a packaging material, wherein the grids in one of the opening regions include exposed grids that are exposed and filled grids that are filled with a second blocking material and randomly distributed.

2. The screen-printing mask according to claim 1, wherein the first blocking material and the second blocking material are a same material.

3. The screen-printing mask according to claim 1, wherein the filled grids are used for forming bubble structures in a packaging material printed onto the OLED substrate through the opening regions.

4. The screen-printing mask according to claim 1, wherein:
a metal layer is on the regions of the OLED substrate to be filled with the packaging materials, the metal layer having a plurality of openings therein, and a pattern of the filled grids corresponding to a pattern of the openings in the metal layer.

5. A method for fabricating a screen-printing mask for packaging organic light-emitting diode (OLED) products, comprising:
providing a screen, the screen including a plurality of grids; and
forming a masking layer on the screen, the masking layer including opening regions and blocking regions, the blocking regions being filled with a first blocking material, the opening regions corresponding to regions to be filled with a packaging material on an OLED substrate;
in one of the opening regions where the screen and the opening regions overlap, forming exposed grids that are exposed and forming filled grids that are filled with a second blocking material and randomly distributed.

6. The method according to claim 5, wherein the first blocking material and the second blocking material are a same material.

7. The method according to claim 5, further including:
forming the filled grids in the one of the opening regions with the blocking region in the masking layer through one photolithography process.

8. The method according to claim 5, wherein the filled grids are formed by filling corresponding grids with the second blocking material.

9. The method according to claim 5, wherein the filled girds are used to prevent a packaging material from passing through during a packaging process.

10. The method according to claim 8, wherein an adhesive, a gel, or a combination thereof are used to fill the corresponding grids for forming the filled grids.

11. A packaging method using a screen-printing mask according to claim 1, comprising:
forming a frit pattern on a first substrate using the screen-printing mask, the frit pattern including a plurality of bubble structures; and
aligning and bonding the first substrate with the OLED substrate, and irradiating the frit pattern with a laser.

12. The packaging method according to claim 11, wherein the bubble structures are formed by the filled grids filled with the second blocking material during a packaging process.

13. A display panel, comprising:
a first substrate and an OLED substrate being aligned to each other, and a frit pattern between the first substrate and the OLED substrate for bonding the first substrate and the OLED substrate,
wherein the frit pattern is formed using a screen-printing mask according to claim 1.

14. A display apparatus, including one or more of the display panels according to claim 13.

* * * * *